United States Patent
Chapman et al.

(10) Patent No.: US 11,646,337 B2
(45) Date of Patent: May 9, 2023

(54) METHODS FOR USING A GAS PERMEABLE LAYER TO FORM AIR GAPS IN AN IMAGE SENSOR

(71) Applicant: SEMICONDUCTOR COMPONENTS INDUSTRIES, LLC, Phoenix, AZ (US)

(72) Inventors: Nathan Wayne Chapman, Middleton, ID (US); Brian Anthony Vaartstra, Nampa, ID (US); Amanda Thuy Trang Vu, Nampa, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 301 days.

(21) Appl. No.: 16/948,799

(22) Filed: Oct. 1, 2020

(65) Prior Publication Data
US 2022/0013563 A1    Jan. 13, 2022

Related U.S. Application Data

(60) Provisional application No. 62/705,658, filed on Jul. 9, 2020.

(51) Int. Cl.
*H01L 27/146* (2006.01)

(52) U.S. Cl.
CPC .. *H01L 27/14627* (2013.01); *H01L 27/14621* (2013.01); *H01L 27/14643* (2013.01)

(58) Field of Classification Search
CPC ......... H01L 27/14627; H01L 27/14621; H01L 27/14643; H01L 27/1462
USPC ....................................................... 250/208.1
See application file for complete search history.

(56) References Cited

U.S. PATENT DOCUMENTS

| | | | |
|---|---|---|---|
| 6,339,442 B1 | 1/2002 | Miyamoto | |
| 7,955,764 B2 | 6/2011 | Liu | |
| 8,475,905 B2 | 7/2013 | Abrams | |
| 2007/0141829 A1 | 6/2007 | Ramappa | |
| 2014/0021548 A1 | 1/2014 | Furukawa | |
| 2014/0233039 A1* | 8/2014 | Takahashi | G01N 21/253 356/519 |
| 2018/0012069 A1* | 1/2018 | Chung | G06V 40/1365 |

* cited by examiner

*Primary Examiner* — Que Tan Le
*Assistant Examiner* — Mai Thi Ngoc Tran
(74) *Attorney, Agent, or Firm* — Treyz Law Group, P.C.; Jason Tsai

(57) ABSTRACT

An image sensor with uniform, well-controlled air gaps is provided. A structure that is at least partially filled with organic material may be formed on the image sensor. A hybrid organic/inorganic film layer may be formed over the organic material. The image sensor may then be exposed to energy, which causes the organic material to sublimate through the hybrid film layer, which itself may become a gas permeable layer when exposed to energy. After sublimation, the regions where the organic material was previously filled become air gaps with a low index of refraction. Air gaps formed in this way can be configured over photodiodes as light guides or focusing structures, as concave/convex microlenses, in between photodiodes as isolation structures, in between color filter elements to reduce crosstalk, and/or over microlenses to enhancing focusing power.

20 Claims, 13 Drawing Sheets

METHODS FOR USING A GAS PERMEABLE LAYER TO FORM AIR GAPS IN AN IMAGE SENSOR

CROSS-REFERENCE TO RELATED APPLICATIONS

This application claims the benefit of U.S. Provisional Patent Application No. 62/705,658, filed on Jul. 9, 2020, the entire contents of which is incorporated herein by reference.

BACKGROUND

This relates generally to imaging devices, and more particularly, to imaging devices with voids or air gaps.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels. Typical image pixels contain photodiodes for generating charge in response to incident light and associated readout circuitry for reading out the charge accumulated in the photodiode.

It is challenging to create small, uniform air gaps under a film in a conventional image sensor. In particular, the current state-of-the-art technologies do not provide a way of forming well-defined regions with a low refractive index (i.e., with an index of refraction n that is close to 1) at dimensions of less than 10 microns. In other words, image sensors that exist today do not have pattern-able film structures having the same isolation properties of air.

It is within this context that the embodiments described herein arise.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
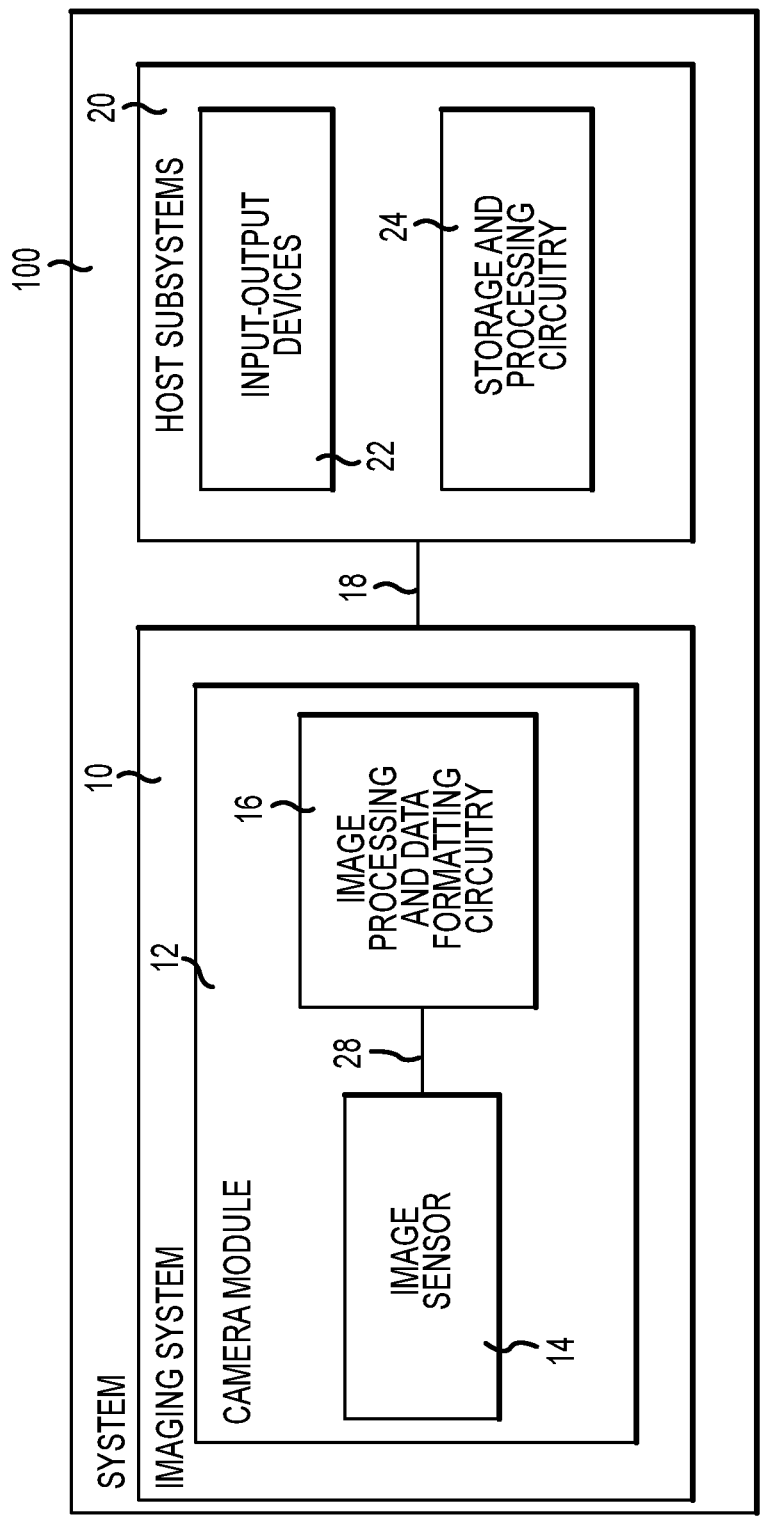
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), may be a surveillance system, or may be any other desired type of system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Path 28 may be a connection through a serializer/deserializer (SERDES) which is used for high speed communication and may be especially useful in automotive systems. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Path 18 may also be a connection through SERDES. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

As described in the background section, creating small, uniform air gaps with a low index of refraction in image sensors can be challenging. It may therefore be desirable to provide improved image sensors with well-defined voids.

In accordance with an embodiment, an image sensor may be provided with well-controlled voids or air gaps by filling certain regions on the image sensor with volatile organic material or preferably with an organic material that can be converted to volatile components with added energy, covering the organic material with a permeable film, and then sublimating away the volatile organic material via energy exposure to create corresponding air gaps under the permeable film. Such method may generally be used to fabricate an image sensor with voids or air gaps of any shape or pattern with features smaller than 100 microns, smaller than 10 microns, or even smaller than 1 micron, etc.

Figure 2A:
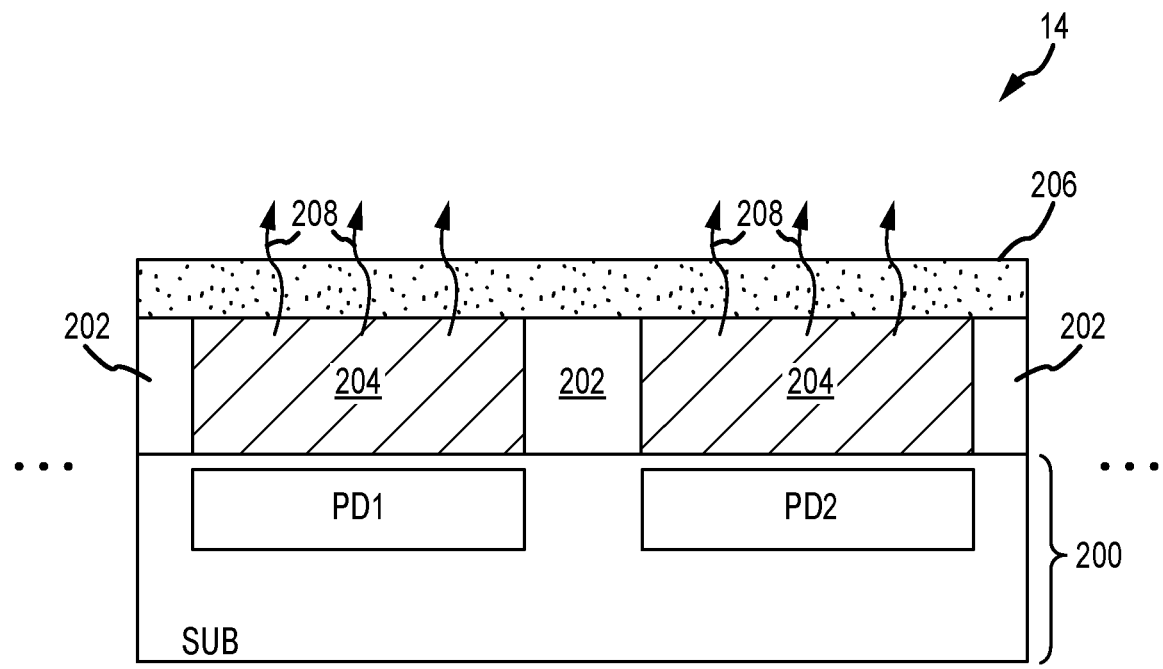
FIG. 2A is a cross-sectional side view of an illustrative image sensor having organic material formed under a hybrid organic/inorganic film in accordance with an embodiment.
Figure 2B:
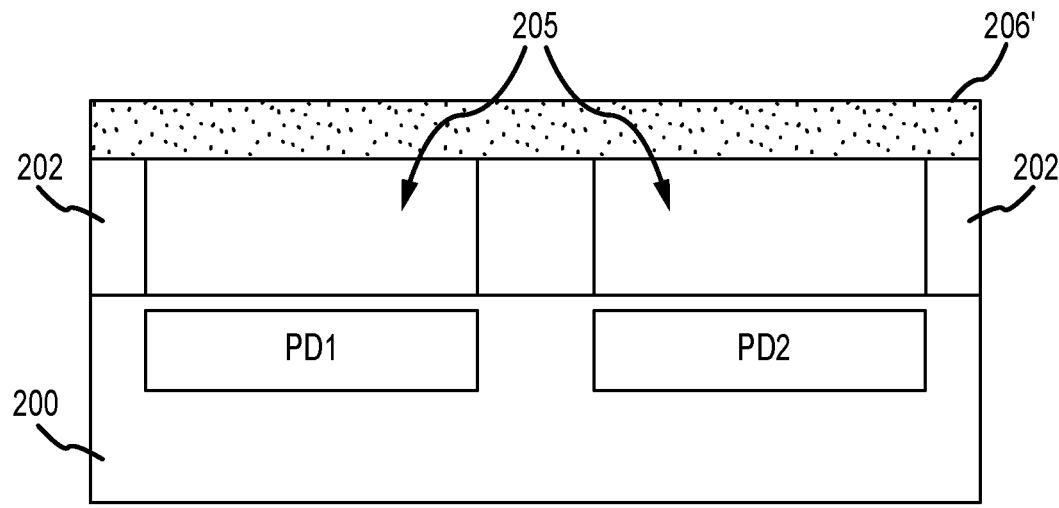
FIG. 2B is a cross-sectional side view of the image sensor of FIG. 2A after the organic material has been sublimated away to form air gaps in accordance with an embodiment.

FIGS. 2A and 2B are cross-sectional side views of an image sensor such as image sensor 14 showing how air gaps can be formed. As shown in FIG. 2A, image sensor 14 may include a semiconductor substrate such as semiconductor substrate 200 (e.g., a p-type substrate layer) and photosensitive elements such as photodiodes PD1 and PD2 formed in semiconductor substrate 200. Although only two photodiodes are shown, image sensor 14 may generally include hundreds or thousands of photodiodes formed. Sidewall structures such as sidewalls 202 may form regions within the sidewalls sometimes referred to as "containers." The sidewall structures 202 may be formed via photolithography, etching, or other patterning techniques. Sidewall structures 202 may, for example, be formed from inorganic material such as nitride, oxide, and/or other suitable nonvolatile material that is not readily sublimated.

The containers or regions within the sidewalls 202 may be filled with organic material such as organic material 204. Organic material 204 may, for example, be any reasonable organic compound, including but not limited to polymer material that can undergo de-polymerization and/or sublimation when it is subjected to energy (e.g., light generally, heat, microwave, laser, infrared radiation, visible radiation, and/or combinations thereof), polymer materials that are hydrolytically cleavable under similar energetic conditions in combination with moisture or other catalysts, or any suitable material that can be sublimated away (sometimes referred to as "sublime-able" material) when exposed to energy.

A hybrid layer such as hybrid layer 206 may be formed over organic material 204. Layer 206 is defined as being a "hybrid" layer because it may include both organic and inorganic material. As an example, hybrid layer 206 may include a combination of both polymer material and inorganic material that are formed over organic material 204 and sidewalls 202 via a spin-on process. As examples, hybrid layer 206 may have an inorganic component formed from silicon oxide spheres or other inorganic spheres or particles, siloxane molecular frameworks, metal-oxide molecular frameworks or scaffolding, or other inorganic, non-subliming (stable) micro/nanostructure. Hybrid layer 206 may therefore sometimes be described as a hybrid organic/inorganic film.

This example is merely illustrative. If desired, other coating or deposition techniques can also be employed to formed hybrid layer 206 over the organic-filled containers. Hybrid film layer 206 may itself undergo partial sublimation when exposed to energy so that layer 206 becomes a lower density, semi-permeable layer (e.g., a gas permeable layer). The gas permeable layer should hold its structure as long as there is an inorganic or other non-sublime-able component that acts as a spacer to hold the hybrid film in place. When the hybrid layer is converted to a low density gas permeable layer, underlying sublime-able material such as organic material 204 can then sublimate though the gas permeable layer, as indicated by arrows 208.

Image sensor 14 of FIG. 2A may then be exposed to energy (e.g., light, thermal energy, microwave, laser, infrared radiation, visible radiation, and/or combinations thereof), which causes the hybrid organic/inorganic layer 206 to become a gas permeable layer 206'. While this energy exposure is taking place, the underlying organic material 204 may sublime (sublimate, evaporate, or vaporize) through gas permeable layer 206', leaving behind a void 205 (sometimes referred to as a gap, cavity, air gap, air-filled gap, air cavity, air gap cavity, etc.), as shown in FIG. 2B. The terms "void," "gap," and "cavity" used herein defined as regions that are devoid or unfilled by solid material. In other words, organic material 204 of FIG. 2A may be completely removed from the containers to create void regions 205, where gas permeable film 206' is now only supported by the sidewall structures 202.

Air gaps or cavities formed in this way are uniform, well-defined in thickness and shape, and can have small feature sizes in the micro or nanoscale range (e.g., features that are less than 100 microns, less than 10 microns, less than 1 micron, less than 0.1 micron, etc.). Such well-controlled air gap regions will have a low refractive index (e.g., a refractive index n of 1.0 or close to 1.0 to reduce undesired scattering), which may be desirable in certain imager applications. In general, this method may be used to create any shape or pattern of air gaps by first patterning the desired shape using organic filler material, overcoating the organic filler material with a hybrid organic/inorganic film, and then subsequently sublimating away at least some of the underlying organic filler material.

Figure 2C:
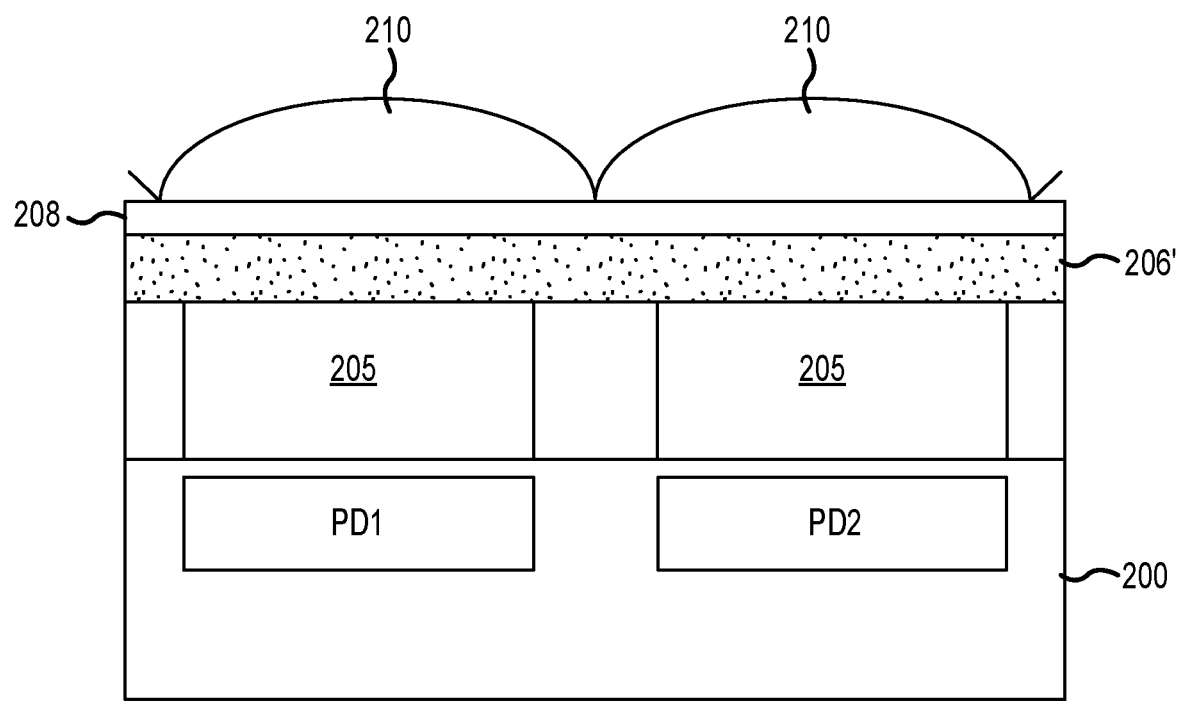
FIG. 2C is a cross-sectional side view of the image sensor of FIG. 2B showing additional imaging structures formed on top of the film in accordance with an embodiment.

FIG. 2C shows how additional imaging structures may be formed on top of gas permeable layer 206'. As shown in FIG. 2C, an additional layer 208 (e.g., an antireflective coating liner, a polymer sealing liner, a planarizing liner, and/or some combination of these liners) may be formed over the gas permeable layer 206'. Layer 208 may be formed via spin-coating, physical vapor deposition (PVD), chemical vapor deposition (CVD), or other suitable film-forming technique. An array of microlenses 210 may be formed on top of layer 208. An image sensor stackup of this type is merely illustrative and is not intended to limit the scope of the present embodiments. In general, image sensors with one or more air gaps formed in this way may also be provided with light guide structures, light blocking structures, color filter structures, transistor structures, metal routing structures, mechanical support structures, one or more buffer layers, one or more optical films, just to name a few.

Figure 3A:
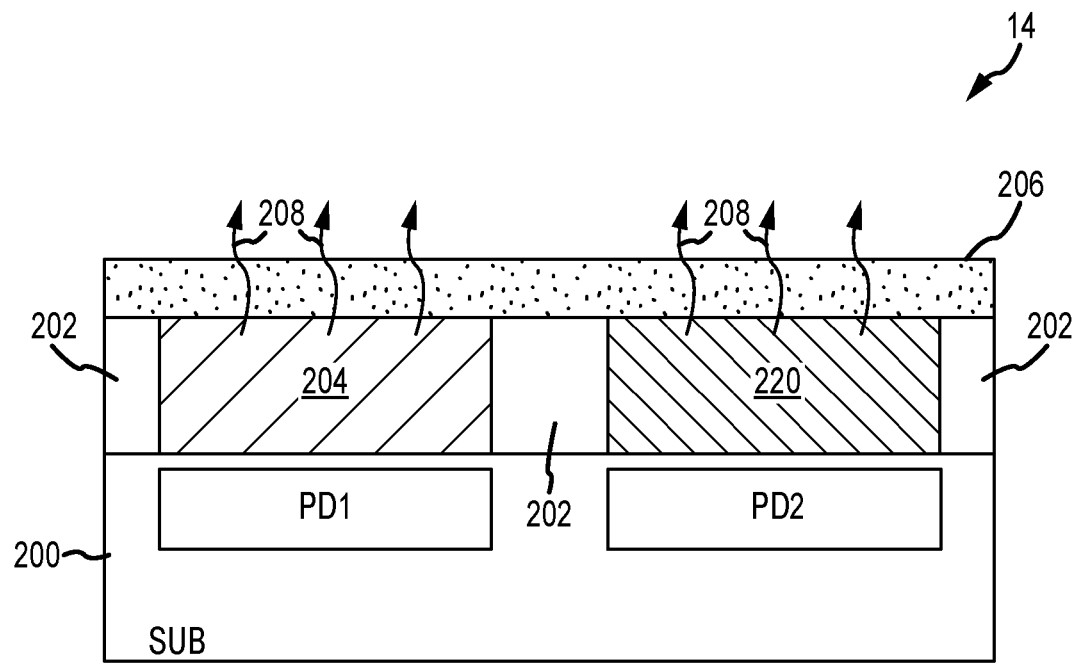
FIG. 3A is a cross-sectional side view of an illustrative image sensor having organic and color filter material formed under a hybrid organic/inorganic film in accordance with an embodiment.

FIG. 3A illustrates another suitable arrangement in which image sensor 14 is optionally provided with color filter material. As shown in FIG. 3A, the container over photodiode PD1 may be filled with sublime-able organic material 204, whereas the container over photodiode PD2 may be filled with color filter material 220 that includes materials with different rates of sublimation. As an example, color filter material 220 may include organic material having a first (higher) rate of sublimation and inorganic color pigment material having a second (lower) rate of sublimation relative to the organic material. If desired, color filter material 220 may be formed using materials with more than two different rates of sublimation (e.g., three or more rates of vaporization, four or more rates of vaporization, five or more rates of vaporization, etc.).

Hybrid organic/inorganic layer 206 may be formed over organic material 204 and color filter material 220. Image sensor 14 of FIG. 3A may then be exposed to energy, which causes the hybrid organic/inorganic layer 206 to become a gas permeable layer 206'. The gas permeable layer 206' will hold its structure as long as there is an inorganic or other stable component that acts as a spacer to hold the permeable film in place after energy exposure. Once hybrid layer 206 becomes a low density gas permeable layer 206', the underlying sublime-able material such as organic material 204 and color filter material 220 can then sublimate though the gas permeable layer 206', as indicated by arrows 208.

Figure 3B:
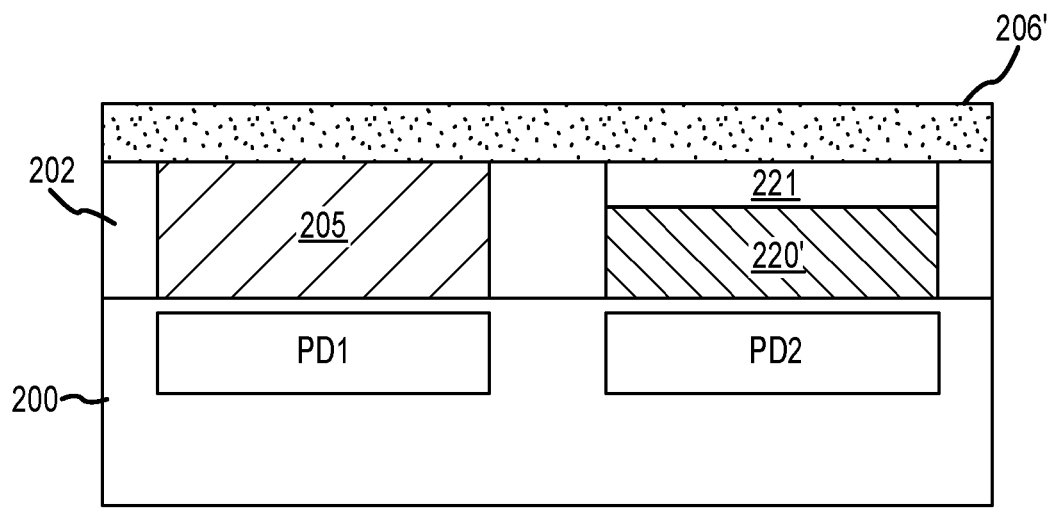
FIG. 3B is a cross-sectional side view of the image sensor of FIG. 3A after at least some the organic material has been sublimated away to form air gaps in accordance with an embodiment.

Due to the different chemical compositions of organic material 204 and color filter material 220, organic material 204 and color filter material 220 may sublime at different rates through gas permeable layer 206'. In the example of FIGS. 3A and 3B, organic material 204 may be entirely sublimated away, leaving behind air gap 205 over photodiode PD1, whereas the color filter material 220 is not sublimated or only partially sublimated away. As shown in FIG. 3B, the organic portion of the color filter material 220 may be sublimated away, leaving behind air gap 221, whereas the inorganic pigment portion 220' of the color filter material remains in the container over photodiode PD2. The illustration of FIG. 3B where air gap 221 and the remaining color filter material 220' are separate continuous portions within the container is merely illustrative. If desired, the air gaps may be formed throughout the color filter material in a homogenous manner. In general, any number of partially-voided containers can be formed in this way.

Figure 4A:
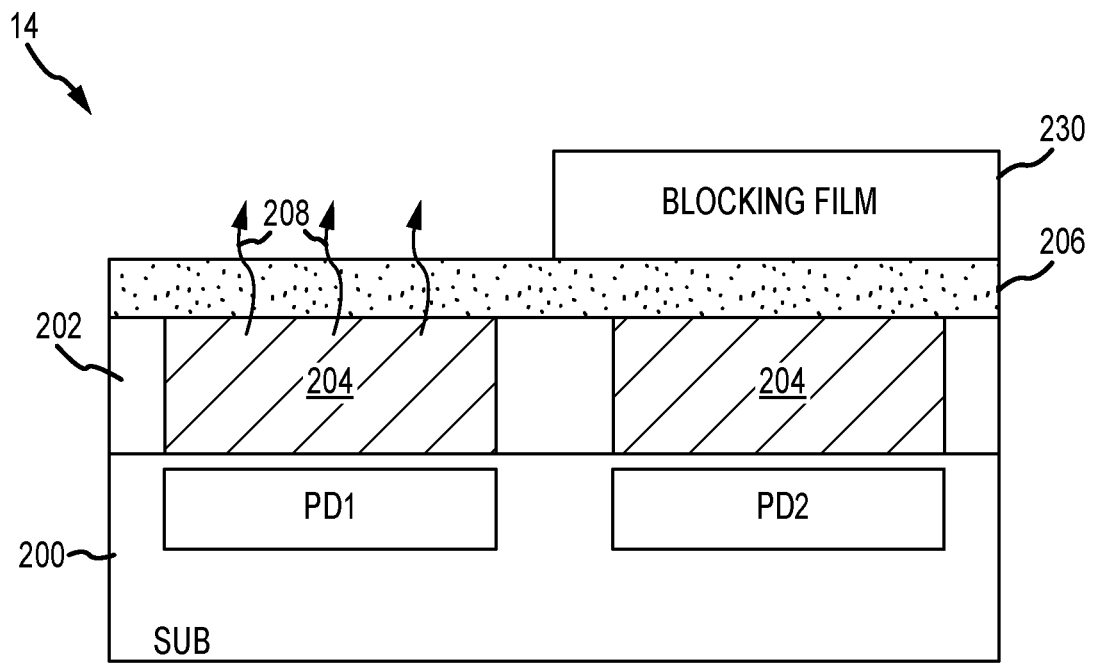
FIG. 4A is a cross-sectional side view showing how a blocking film can be formed over an image sensor for selective removal of organic material in accordance with an embodiment.
Figure 4B:
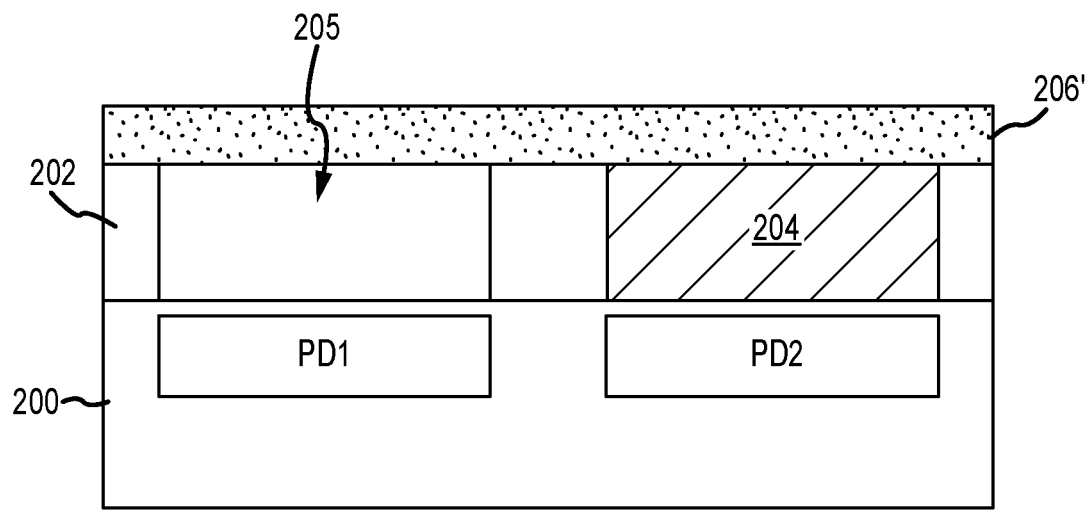
FIG. 4B is a cross-sectional side view of the image sensor of FIG. 4A after the organic material uncovered by the blocking film has been sublimated away to form air gaps in accordance with an embodiment.

If desired, a blocking film may be used to enable selective removal of the organic material. FIG. 4A is a diagram showing how a blocking film such as blocking film 230 may be formed over selected regions of image sensor 14 to prevent the sublimation of the organic material lying directly underneath and overlapping with blocking film 230. In the example of FIG. 4A, blocking film 230 covers the organic material 204 on top of photodiode PD2, whereas the organic material 204 on top of photodiode PD1 remains uncovered by blocking film 230. During an energy exposure phase such as when exposing the imaging circuitry to ultraviolet (UV) light, blocking film 230 may prevent the UV light from reaching the underlying organic material 204 on top of photodiode PD2. The organic material in the exposed region(s) that are not covered by blocking film 230 will still evaporate through the gas permeable film 206, as indicated by arrows 208, leaving behind air gap region 205 (see FIG. 4B). The blocking film 230 may be subsequently removed. As shown in FIG. 4B, all of the organic material 204 in the container(s) covered by the blocking film 230 will remain in the final product (e.g., none of the organic material 204 in the container(s) covered by the blocking film 230 has been sublimated away via energy exposure).

This example in which blocking film 230 is a patterned light blocking layer is merely exemplary. In other suitable embodiments, film 230 can be a thermal blocking film, a microwave blocking film, an infrared blocking film, a radiation blocking film, a combination thereof, or other suitable layers for blocking energy transfer. In yet other suitable arrangements, film 230 might be a gas impermeable layer configured to block sublimation of the underlying organic material covered such gas impermeable layer. If desired, film 230 might not entirely inhibit sublimation but could potentially be used to control the rate of sublimation from the underlying organic material covered by such film.

Figure 5A:
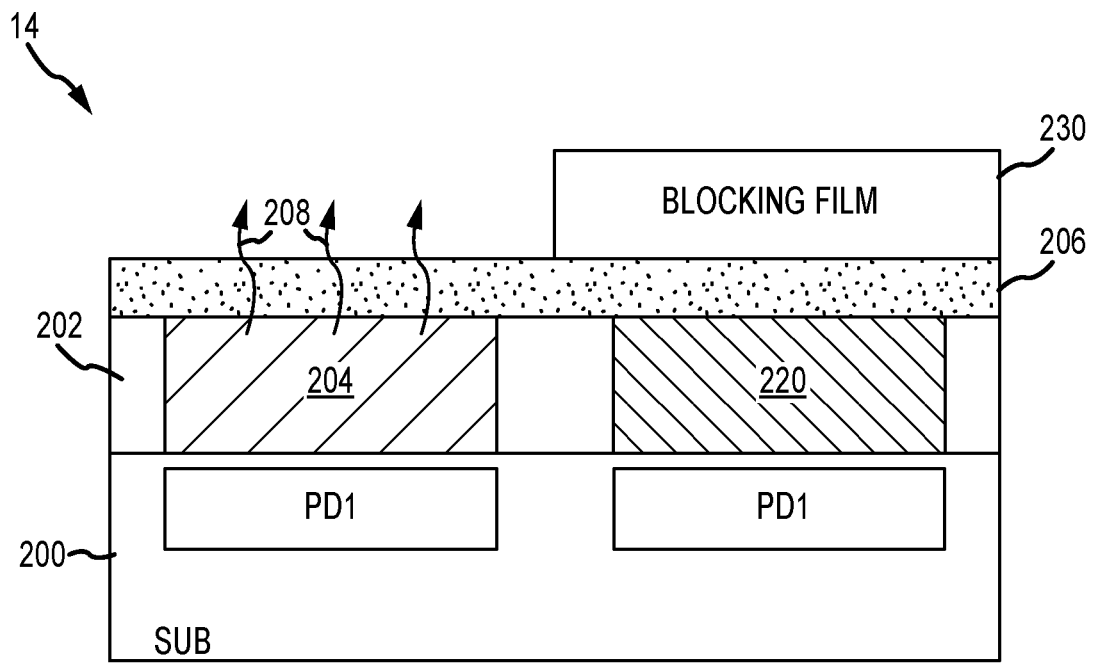
FIG. 5A is a cross-sectional side view showing how a blocking film can be formed over an image sensor to prevent sublimation of color filter material in accordance with an embodiment.
Figure 5B:
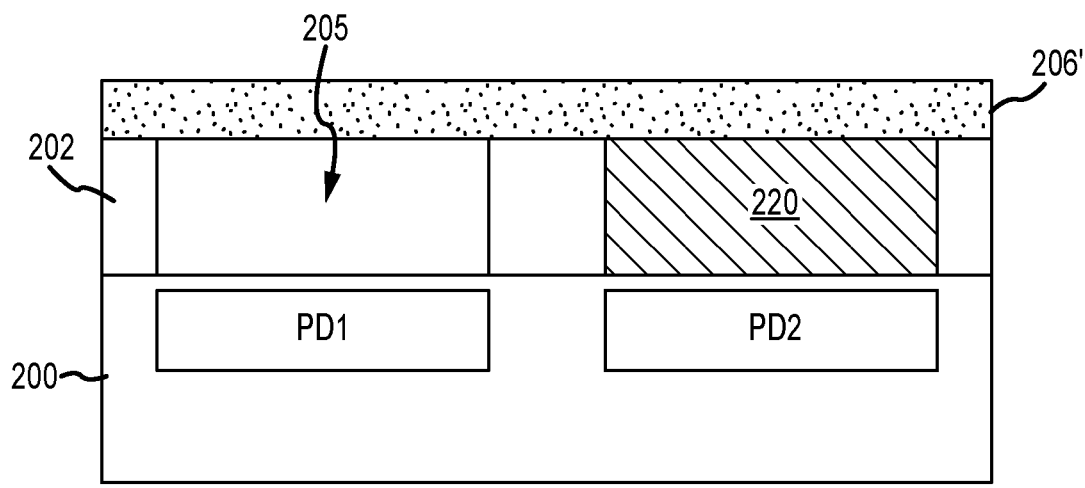
FIG. 5B is a cross-sectional side view of the image sensor of FIG. 5A after the organic material uncovered by the blocking film has been sublimated away to form air gaps in accordance with an embodiment.

The example of FIGS. 4A and 4B in which blocking film 230 prevents sublimation of organic material 204 is merely illustrative. FIGS. 5A and 5B illustrates another example in which blocking film 230 is configured to prevent sublimation of color filter material 220. As shown in FIG. 5A, blocking film 230 covers the color filter (CF) material 220 on top of photodiode PD2, whereas the organic material 204 on top of photodiode PD1 remains uncovered by blocking film 230. During an energy excitation phase such as when exposing the imaging sensor circuitry to light, blocking film 230 may prevent the light from reaching the underlying CF material 220 on top of photodiode PD2. The organic material 204 in the exposed region(s) that are not covered by blocking film 230 will still sublime through the gas permeable film, as indicated by arrows 208, leaving behind air gap region 205 (see FIG. 5B). The blocking film 230 may be subsequently removed. As shown in FIG. 5B, all of the color filter material 204 in the container(s) covered by the blocking film 230 will remain in the final product (e.g., none of the color filter material 220 in the container(s) covered by the blocking film 230 has been removed).

This example in which blocking film 230 is a patterned light blocking layer is merely exemplary. In other suitable embodiments, film 230 can be a thermal blocking film, a microwave blocking film, an infrared blocking film, a radiation blocking film, a combination thereof, or other suitable layers for blocking energy transfer. In yet other suitable arrangements, film 230 might be a gas impermeable layer configured to block sublimation of the underlying organic material covered such gas impermeable layer. If desired, film 230 might not entirely inhibit sublimation but could potentially be used to control the rate of sublimation from the underlying organic material covered by such film.

Figure 6:
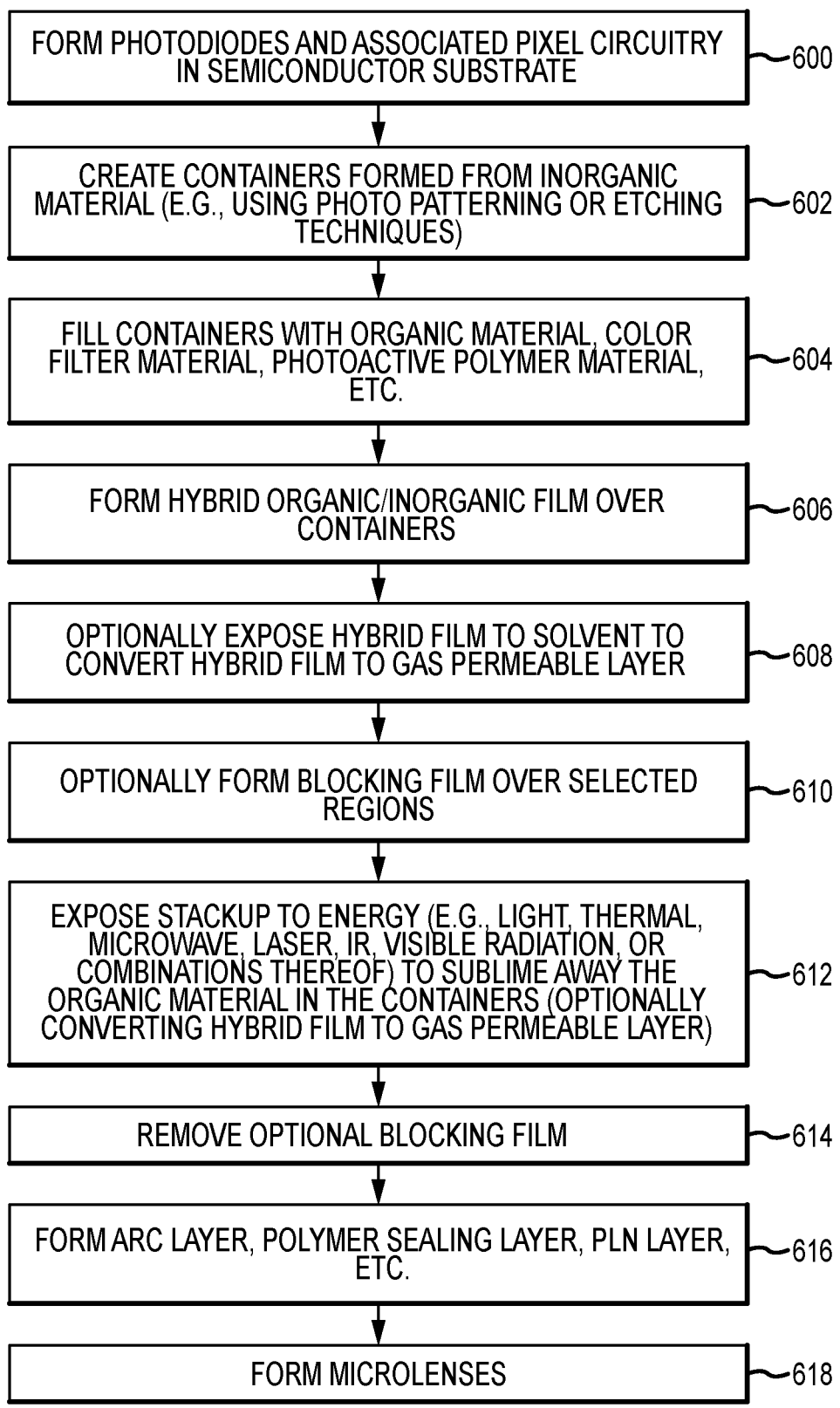
FIG. 6 is a flow chart of illustrative steps for manufacturing image sensor circuitry with air gaps or voids in accordance with an embodiment.

FIG. 6 is a flow chart of illustrative steps for fabricating an image sensor with uniform, well-controlled air gaps. At step 600, photosensitive elements such as photodiodes and associated image pixel circuitry may be formed in a semiconductor substrate. The associated image pixel circuitry may include charge transfer gates, floating diffusion regions, reset transistors, source follower transistors, row select transistors, capacitors, and/or other suitable pixel components. A front-side illuminated (FSI) image sensor or a backside illuminated (BSI) image sensor may be formed.

At step 602, one or more containers may be created by fabricating sidewalls formed from inorganic material (see, e.g., sidewall structures 202 in FIGS. 2-5). The sidewalls may be formed by photo-patterning or etching inorganic material such as nitride, oxide, or other suitable stable/non-volatile material that is non-sublime-able during the energy exposure phase. When viewing the image sensor towards the surface configured to receive incoming light, the sidewall structures may form an inorganic grid or matrix with an array of slots or containers surrounded by neighboring sidewalls.

At step 604, the containers or slots formed during step 602 may be filled with organic material, inorganic material, color filter material, photoactive polymer material, photoresist material, a mix of organic and inorganic material, a combination of these materials, and/or other suitable compounds. As an example, a given region on the image sensor may be filled using only organic material such as a photoactive polymer material. As another example, a given region may be filled using color filter material having both inorganic non-sublime-able pigments and organic sublime-able materials. As yet another example, a given region may be filled using an inorganic compound.

At step 606, a hybrid organic/inorganic film may be formed to cover the entire image sensor (see, e.g., hybrid layer 206 of FIGS. 2-5). This hybrid film may be fabricated via a spin-on process. If desired, the hybrid film may alternatively be formed via physical vapor deposition (PVD), chemical vapor deposition (CVD), or other suitable film-forming techniques. For example, the hybrid layer may have an inorganic portion formed from silicon oxide spheres or other inorganic spheres or particles, siloxane molecular frameworks, metal-oxide molecular frameworks or scaffolding, or other inorganic, non-subliming (stable) micro/nanostructure.

At step 608, the hybrid film layer may optionally be exposed to a solvent to convert the hybrid film layer to a semi-permeable layer (e.g., a gas permeable layer). The solvent may be used to remove only the organic components or some fraction of the organic components within the hybrid film so that a relatively more porous or permeable layer remains at the end of step 608. Suitable solvents may include propylene glycol monomethyl ether acetate (PG-MEA), N-methyl-2-pyrrolidone (NMP), toluene, xylenes, trichloroethylene, cyclohexananone, cyclopentanone, butyrolactone, acetone, acetone/isopropanol mixtures, or other suitable compounds.

At step 610, a blocking film (see, e.g., blocking film 230 of FIGS. 4A and 5A) may optionally be formed over selected regions of the image sensor. The blocking film may be a light blocking layer (e.g., an optically opaque layer), a heat blocking layer, a microwave blocking layer, an infrared blocking layer, a radiation blocking layer, some combination of these layers, and/or other suitable layers for selectively inhibiting energy transfer.

At step 612, the image sensor circuitry (sometimes referred to as the image sensor "stackup") may be exposed to energy. For example, the image sensor stackup may be exposed to light (e.g., ultraviolet light), thermal energy, microwave, laser, infrared light, visible radiation, or combinations thereof to sublimate away any exposed organic material. For instance, the organic material, the organic portion of the color filter elements, or other volatile/unstable material that are not covered by the optional blocking film may be removed via sublimation through the gas permeable film layer when exposed to energy, leaving behind corresponding air gaps. On the other hand, any portion of the image sensor that is covered by the optional blocking film may remain intact. If the hybrid film was not previously converted to a gas permeable layer at optional step 608, the hybrid film will be converted to a gas permeable layer when exposed to energy during step 612 (see, e.g., semi-permeable layer 206' in FIGS. 2-5).

At step 614, the optional blocking film (if formed) is removed. At step 616, an antireflective coating (ARC) layer, a polymer sealing layer, a planarization layer, and/or some combination of these layers) may be formed over the gas permeable layer (see, e.g., layer 208 in FIG. 2C). These layer(s) may be formed via spin-coating, physical vapor deposition (PVD), chemical vapor deposition (CVD), or other suitable deposition processes.

At step 618, an array of microlenses (see, e.g., microlenses 210 in FIG. 2C) may be formed over the image sensor stackup. An image sensor stackup of this type is merely illustrative and is not intended to limit the scope of the present embodiments. Although the methods of operations are described in a specific order, it should be understood that other operations may be performed in between described operations, or described operations may be adjusted so that they occur at slightly different times. In general, the overall processing steps may also include steps for forming light guide structures, light blocking structures, color filter structures, transistor structures, metal routing structures, mechanical support structures, one or more buffer layers, one or more optical films, or other suitable layers in an image sensor, which are omitted from FIG. 6 in order to avoid obscuring the present embodiments.

Figure 7A:
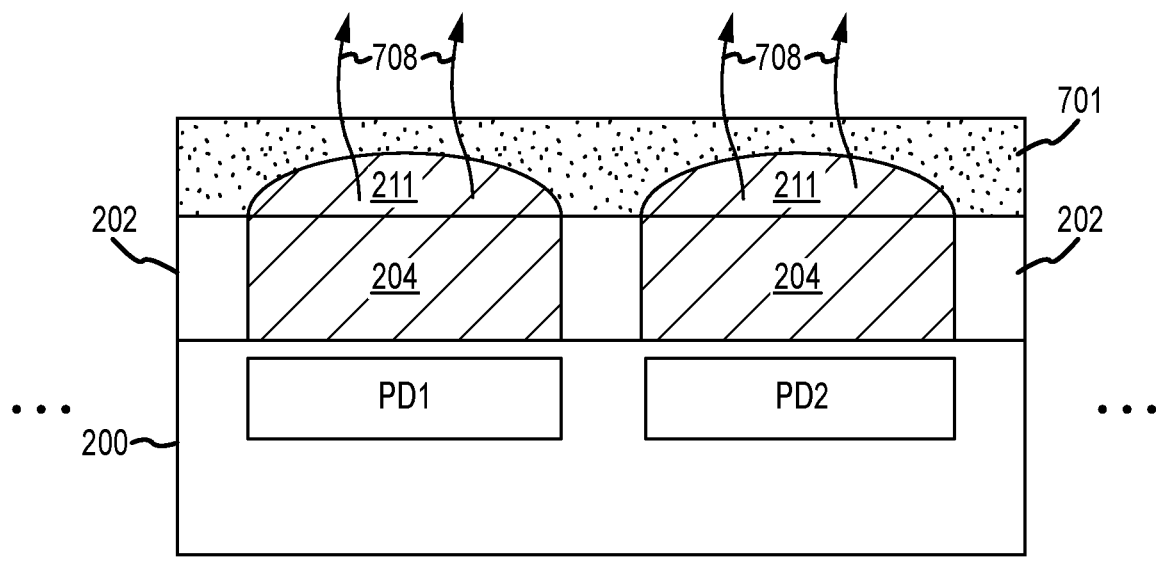
FIG. 7A is a cross-sectional side view of an illustrative image sensor having a convex microlens structure filled with organic material in accordance with an embodiment.
Figure 7B:
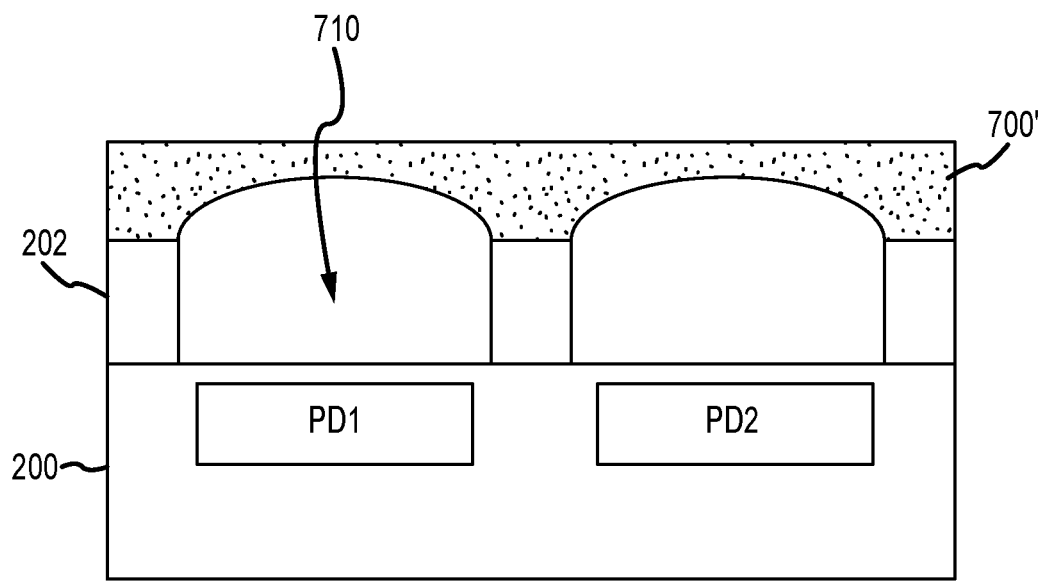
FIG. 7B is a cross-sectional side view of the image sensor of FIG. 7A after the organic material has been sublimated away to form an air-filled convex microlens structure in accordance with an embodiment.

In general, the sublimed regions that become air gaps can be patterned, formed, or reflowed into any desired shape to provide a flat interface (e.g., a planar interface between the air gap and the gas permeable film), a curved interface, or other suitable options. FIGS. 7A and 7B illustrate another suitable embodiment in which convex microlenses air gaps can be formed. As shown in FIG. 7A, the containers may be filled with organic material 204, and organic microlens structures 211 may be formed over the containers. Similar to organic material 204, microlens structures 211 may be formed from any reasonable organic compound, including but not limited to polymer material that can undergo de-polymerization and/or sublimation when exposed to some energy source. A hybrid organic/inorganic film layer such as layer 700 may be formed over the organic microlens structures 211. The image sensor stackup may then be exposed to energy (e.g., light, heat, microwave, laser, infrared radiation, visible radiation, and/or combinations thereof), and the underlying sublime-able material such as the organic material 204 within the containers and the organic microlens structures 211 over the containers may be sublimed away through the hybrid film, as indicated by arrows 708, leaving behind air gaps 710 (as shown in FIG. 7B). Hybrid organic/inorganic film may be converted to a semi-permeable layer 700' (e.g., a gas permeable layer) using either some type of solvent (such as using step 608 of FIG. 6) or during the energy exposure phase (such as during step 612 of FIG. 6). Formed in this way, air gaps 710 may be configured as convex microlenses for focusing light towards the corresponding photodiodes. Since the convex microlens 710 is an air-filled void region, it exhibits a low index of refraction (e.g., a refractive index n of 1.0).

Figure 8A:
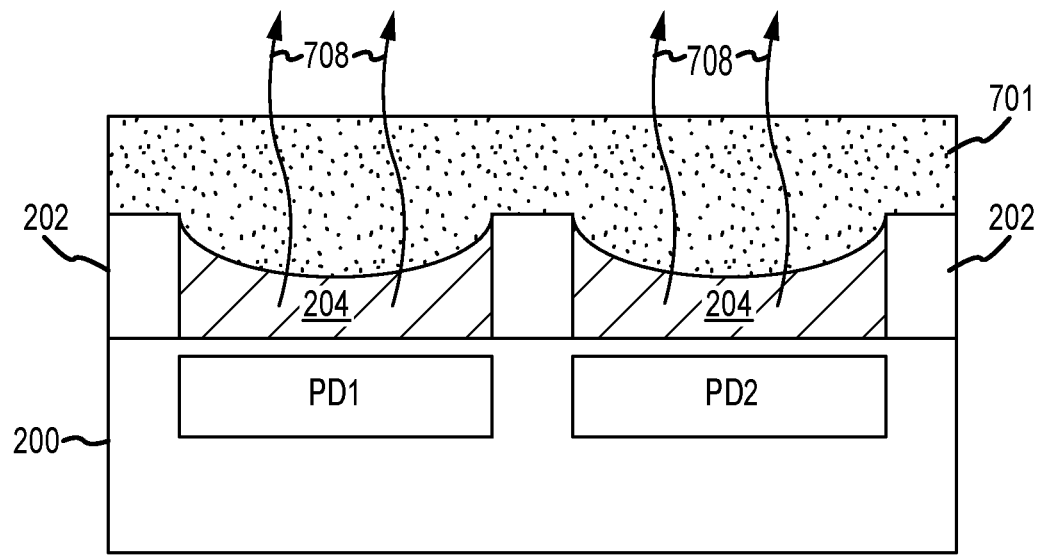
FIG. 8A is a cross-sectional side view of an illustrative image sensor having a concave microlens structure filled with organic material in accordance with an embodiment.
Figure 8B:
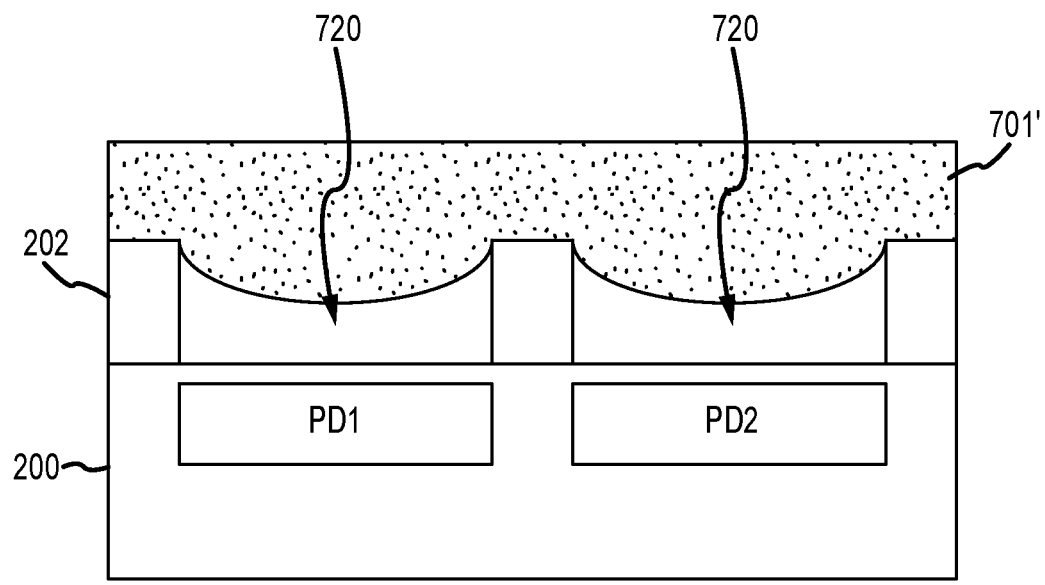
FIG. 8B is a cross-sectional side view of the image sensor of FIG. 8A after the organic material has been sublimated away to form an air-filled concave microlens structure in accordance with an embodiment.

FIGS. 8A and 8B illustrate yet another suitable embodiment in which concave microlens air gaps are formed. As shown in FIG. 8A, the containers may be filled with organic material 204 (e.g., volatile polymer material) to have a curved surface having a dip towards the center of each container to yield a concaving curvature. A hybrid organic/inorganic film layer such as layer 701 may be formed over the organic material.

The image sensor stackup may then be exposed to energy (e.g., light, heat, microwave, laser, infrared radiation, visible radiation, and/or combinations thereof), and the underlying sublime-able material such as the concaving organic material 204 within the containers may be sublimed away through the hybrid film, as indicated by arrows 708, leaving behind voided air gaps 720 (as shown in FIG. 8B). Hybrid organic/inorganic film may be converted to a semi-permeable layer 701' (e.g., a gas permeable layer) using either a solvent (see step 608 of FIG. 6) or during the energy exposure phase (see step 612 of FIG. 6). Formed in this way, air gaps 720 may be configured as concave microlens structures. Since the concave microlens 720 is an air-filled gap region, it exhibits a low index of refraction (e.g., a refractive index n of 1.0).

Figure 9A:
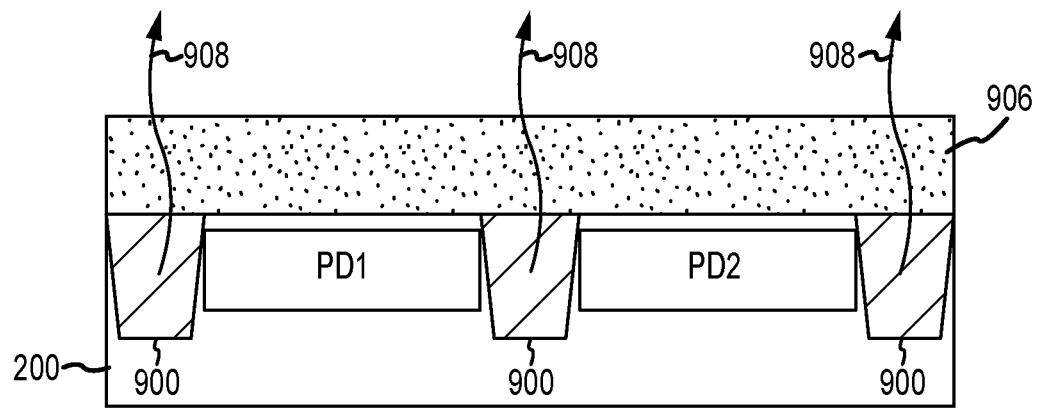
FIG. 9A is a cross-sectional side view of an illustrative image sensor having semiconductor trench isolation structures filled with organic material in accordance with an embodiment.
Figure 9B:
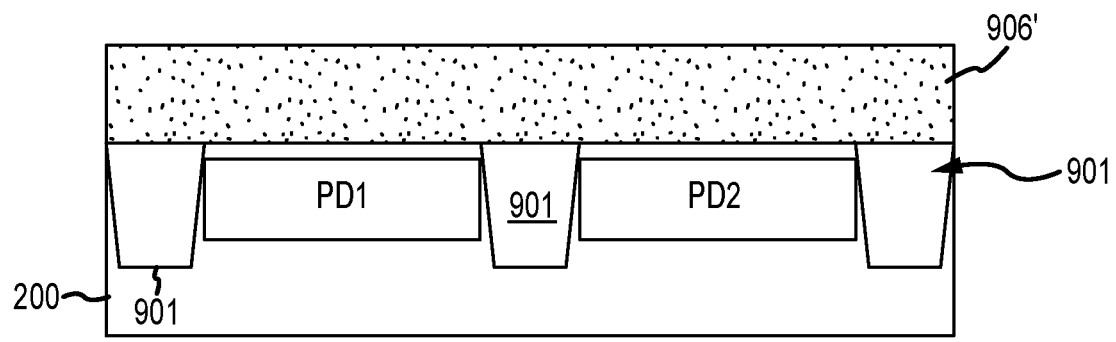
FIG. 9B is a cross-sectional side view of the image sensor of FIG. 9A after the organic material has been sublimated away to form air-filled semiconductor trench isolation structures in accordance with an embodiment.

The examples of FIGS. 2-8 in which air gaps are formed directly over the photodiodes are merely illustrate. FIGS. 9A and 9B illustrate yet another suitable embodiment in which air gaps are formed in between adjacent photodiodes. As shown in FIG. 9A, isolation structures such as trench isolation structures 900 that are filled with organic material may be formed in the semiconductor substrate 200 between neighboring photodiodes. Isolation structures 900 are therefore sometimes referred to as semiconductor trench isolation structures. The organic material that is used to fill isolation structures 900 may be formed from any reasonable volatile/unstable organic compound, including but not limited to polymer material that can undergo de-polymerization and/or sublimation when exposed to some energy source.

A hybrid organic/inorganic film layer such as layer 906 may be formed over substrate 200. The image sensor stackup may then be exposed to energy (e.g., light, heat, microwave, laser, infrared radiation, visible radiation, and/or combinations thereof), and the underlying sublime-able material such as the organic material within semiconductor trench isolation structures 900 may be sublimed away through the hybrid film, as indicated by arrows 908, leaving behind corresponding air gaps 901 (as shown in FIG. 9B). Hybrid organic/inorganic film may be converted to a semi-permeable layer 906' (e.g., a gas permeable layer) using either some type of solvent (such as using step 608 of FIG. 6) or during the energy exposure phase (such as during step 612 of FIG. 6). Formed in this way, air gaps 901 may be configured as semiconductor isolation gap/voided regions. Air gaps 901 may be shallow trench air gap regions or backside deep trench air gap regions (as examples). Since the isolation region 901 is an air-filled void region, it exhibits a low index of refraction (e.g., a refractive index n of 1.0), which can reduce optical crosstalk between adjacent photodiodes.

Figure 10A:
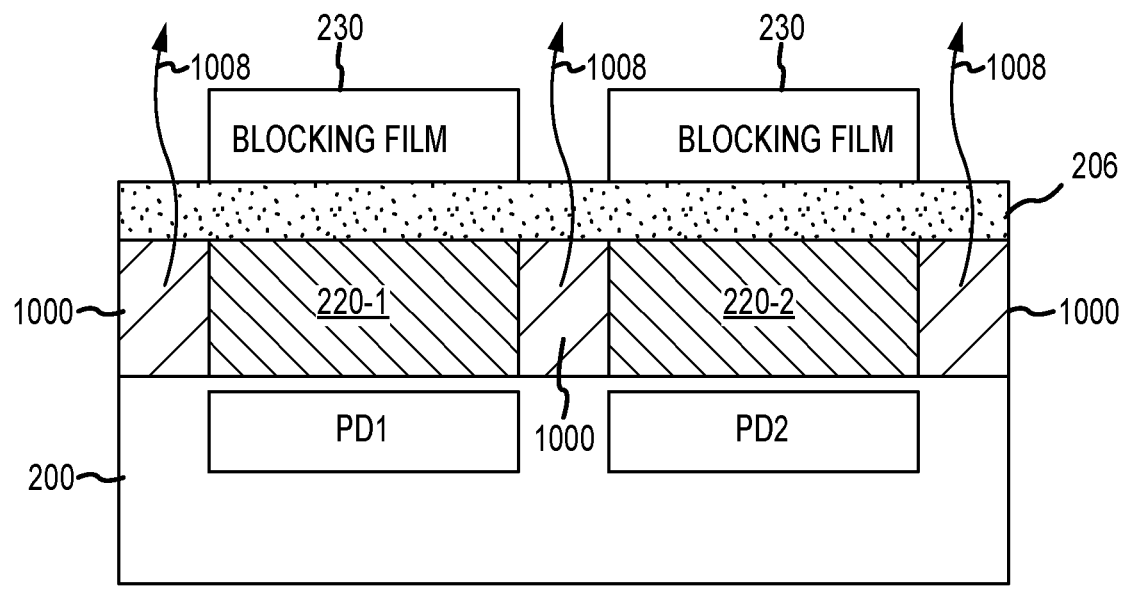
FIG. 10A is a cross-sectional side view showing color filter isolation structures filled with organic material in accordance with an embodiment.
Figure 10B:
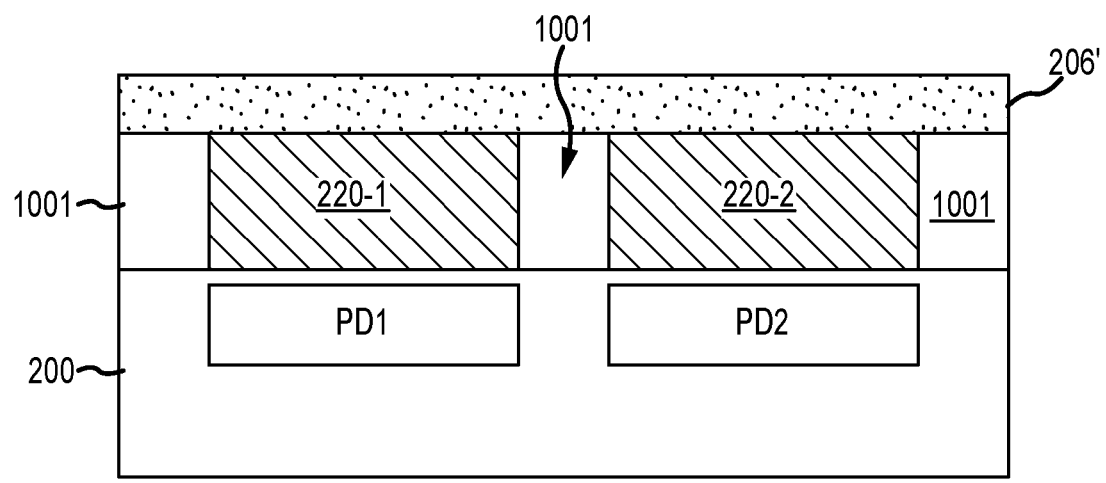
FIG. 10B is a cross-sectional side view of the image sensor of FIG. 10A after the organic material has been sublimated away to form air-filled color filter isolation structures in accordance with an embodiment.

FIGS. 10A and 10B illustrate yet another suitable embodiment in which air gaps are formed in between adjacent color filter elements. As shown in FIG. 10A, the sidewall structures 100 forming containers for the color filter material may be filled with organic material. In the example of FIG. 10A, color filter material 220-1 is formed over photodiode PD1, whereas color filter material 220-2 is formed over photodiode PD2. The organic material that is used to fill the sidewall structures 100 may be formed from any reasonable volatile/unstable organic compound, including but not limited to polymer material that can undergo de-polymerization and/or sublimation when exposed to energy.

A hybrid organic/inorganic film layer such as layer 206 may be formed over the sidewalls 100 and the color filter material. Blocking film 230 may then optionally be patterned over hybrid layer 206 to cover only the color filter material while leaving the organic sidewall structures 100 exposed. The image sensor stackup may then be exposed to energy (e.g., light, heat, microwave, laser, infrared radiation, visible radiation, and/or combinations thereof), and the exposed sublime-able material such as the organic material within the sidewall structures 1000 may be sublimated away through the hybrid film, as indicated by arrows 1008, leaving behind corresponding air gaps 1001 (as shown in FIG. 10B). Hybrid organic/inorganic film may be converted to a semi-permeable layer 206' (e.g., a gas permeable layer) using either some type of solvent (such as using step 608 of FIG. 6) or during the energy exposure phase (such as during step 612 of FIG. 6). Formed in this way, air gaps 1001 may collectively form an air-filled cavity grid (sometimes referred to as color filter isolation structures) surrounding each of the individual color filter elements. Since this grid is an air-filled void region, it exhibits a low index of refraction (e.g., a refractive index n of 1.0), which can reduce optical crosstalk between adjacent pixels.

Figure 10C:
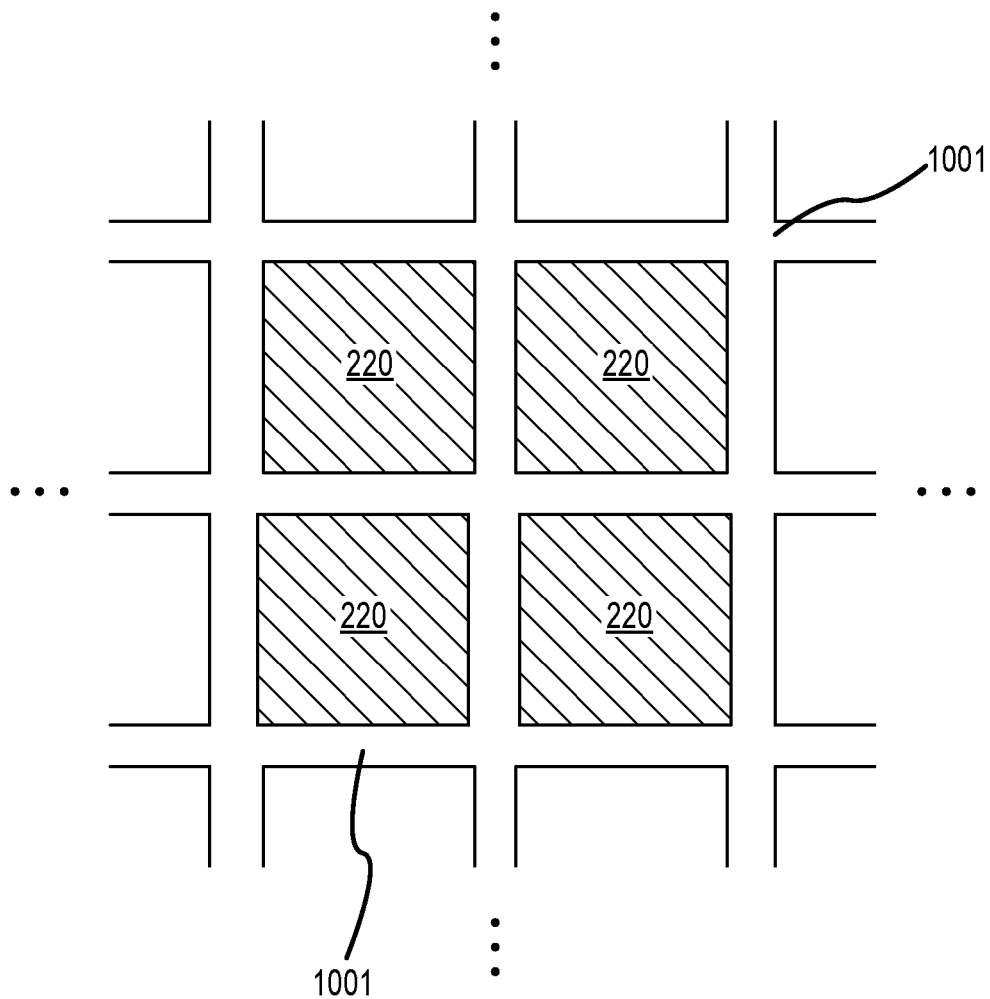
FIG. 10C is a top plan view of the image sensor of FIG. 10B showing an array of color filter elements surrounded by a grid of the air-filled color filter isolation structures in accordance with an embodiment.

FIG. 10C is a top plan (layout) view of the image sensor of FIG. 10B showing an array of color filter elements surrounded by a grid/matrix of the air-filled color filter isolation structures. As shown in FIG. 10C, the sidewall structures 1001 may collectively form a voided air-filled ring around each color filter container. Formed in this way, the organic material previously filling the sidewalls may be completely removed via sublimation, and gas permeable film 206' is now only supported by the array of color filter elements 220. This configuration in which the color filter elements are surrounded by an air-gap grid may sometimes be referred to as color filter in a voided box or as color filter in an air-filled box.

Figure 11A:
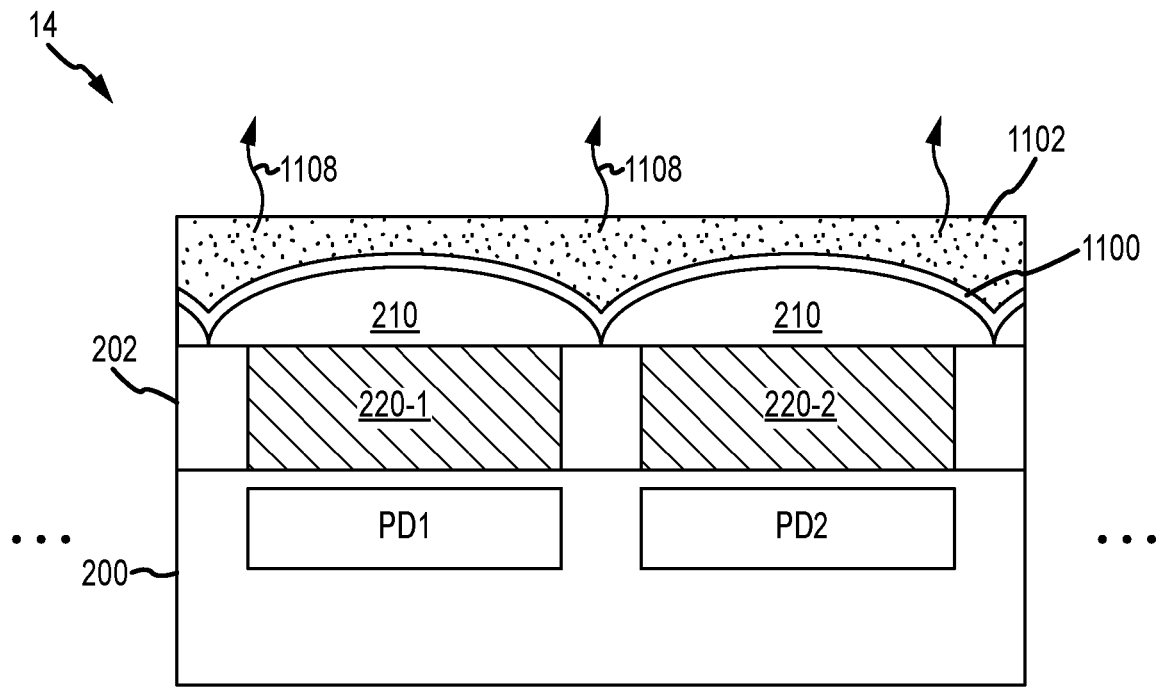
FIG. 11A is a cross-sectional side view of an illustrative image sensor having a hybrid organic/inorganic film formed over an array of microlenses in accordance with an embodiment.

The examples of FIGS. 2-10 in which energy exposure is used to sublimate an underlying layer beneath a gas permeable layer is merely illustrative and is not intended to limit the scope of the present embodiments. If desired, the energy exposure can also be used to modify the gas permeable layer itself. FIG. 11A is a cross-sectional side view of an illustrative image sensor 14 having a hybrid organic/inorganic film formed over an array of microlenses. As shown in FIG. 11A, color filter material 220-1 may be formed within a first container over photodiode PD1, and color filter material 220-2 may be formed within a second container over photodiode PD2. The container sidewalls 202 may be filled using material such as nitride, oxide, and/or other suitable color filter isolation material.

An array of microlenses 210 may be formed over the color filter elements. In particular, an inorganic coating layer such as inorganic layer 1100 may be formed on the array of microlenses 210. Inorganic coating layer 1100 (e.g., an inorganic antireflective coating layer formed from silicon oxide, silicon nitride, or other suitable inorganic material) may be impermeable to gas, thus preventing any underlying layer such as the microlenses 210 and color filter elements 220 from sublimating even when exposed to energy.

Still referring to FIG. 11, a hybrid organic/inorganic film 1102 may be formed over the inorganic coating layer 1100. This hybrid film may be fabricated via a spin-on process, physical vapor deposition (PVD), chemical vapor deposition (CVD), or other suitable film-forming techniques. As examples, the hybrid layer may have an inorganic portion formed from silicon oxide spheres or other inorganic spheres or particles, siloxane molecular frameworks, metal-oxide molecular frameworks or scaffolding, or other inorganic, non-subliming (stable) micro/nanostructure.

Figure 11B:
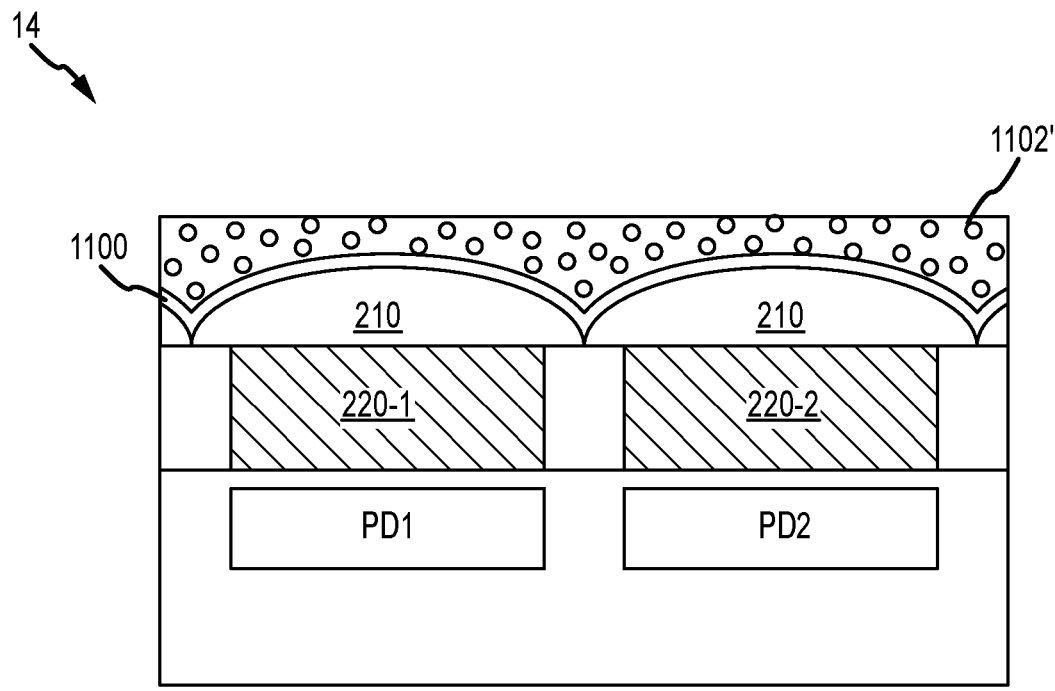
FIG. 11B is a cross-sectional side view of the image sensor of FIG. 11A after the organic material in the film has been sublimated away to form a low refractive index layer in accordance with an embodiment.

The image sensor stackup may then be exposed to energy (e.g., light, heat, microwave, laser, infrared radiation, visible radiation, and/or combinations thereof), and the hybrid film 1102 itself may be converted (transformed or modified) into a lower density gas permeable layer 1102', as indicated by arrows 1108. Since inorganic coating layer 1100 is formed over the microlens array, all of the image sensor stackup under the inorganic coating layer 110 is protected from sublimation and remains completely intact. As shown in FIG. 11B, however, the hybrid film itself may become a lower density gas permeable layer 1102' due to its organic portions behind sublimed away (see air gaps within layer 1102' itself), leaving behind the inorganic framework or scaffolding holding up layer 1102'. Configured and formed in this way, the image sensor is provided with a low refractive index top layer (e.g., a refractive index n of 1.0), which enhances the focusing power of the underlying microlens array. The top uniform and stable low-index layer 1102' may be further coated with a sealant, adhesive layer, or other suitable cover layer.

The embodiments of FIGS. 2-11 are not mutually exclusive. In other words, an image sensor 14 might have a first portion having a cross-section as shown in FIG. 2B, a second portion having a cross-section as shown in FIG. 3B, a third portion having a cross-section as shown in FIG. 4B, and/or a fourth portion having a cross-section as shown in FIG. 5B. An image sensor 14 might also have one region having convex air-filled microlenses as shown in FIG. 7B and another region having concave air-filled microlenses as shown in FIG. 8B. The same image sensor 14 of the type described in connection with FIGS. 2-8 may also include air-filled semiconductor trench isolation structures 901 shown in FIG. 9B and/or the air-filled sidewall structures 1001 shown in FIG. 10B. If desired, the same image sensor 14 of the type described in connection with FIGS. 2-10 may also be provided with a low-index low-density layer over the microlens array, as shown in FIG. 11B. The illustrative steps of FIG. 6 may also be modified or applied to manufacture any of the air gap or low index structures described in connection with the embodiments of FIGS. 7-11.

The foregoing is merely illustrative of the principles of this invention and various modifications can be made by those skilled in the art. The foregoing embodiments may be implemented individually or in any combination.

What is claimed is:

1. A method of fabricating an image sensor, comprising:
   forming photodiodes in a semiconductor substrate;
   filling structures with organic material;
   forming a hybrid organic and inorganic layer over the structures; and
   forming air gaps by using energy to convert the hybrid organic and inorganic layer to a gas permeable layer and to sublimate the organic material through the gas permeable layer.

2. The method of claim 1, wherein the air gaps are formed directly over the photodiodes.

3. The method of claim 1, further comprising:
   filling additional structures with color filter material; and
   using the energy to only partially sublimate the color filter material through the gas permeable layer.

4. The method of claim 1, further comprising:
   filling additional structures with organic material; and
   forming a blocking film over the additional structures to prevent the organic material in the additional structures from sublimating through the gas permeable layer.

5. The method of claim 1, further comprising:
   filling additional structures with color filter material; and
   forming a blocking film over the additional structures to prevent the color filter material in the additional structures from sublimating through the gas permeable layer.

6. The method of claim 1, wherein forming the air gaps comprises forming air-filled convex microlenses.

7. The method of claim 1, wherein forming the air gaps comprises forming air-filled concave microlenses.

8. The method of claim 1, wherein forming the air gaps comprises forming air-filled trench isolation structures in the semiconductor substrate.

9. The method of claim 1, further comprising:
forming color filter elements over the photodiodes, wherein forming the air gaps comprises forming air-filled sidewall structures surrounding the color filter elements.

10. The method of claim 1, wherein forming the hybrid organic and inorganic layer over the structures comprises forming a film with an inorganic molecular framework that remains in the gas permeable layer.

11. The method of claim 1, wherein using the energy comprises exposing the image sensor to energy selected from the group consisting of: light, heat, microwave, laser, infrared radiation, and visible radiation.

12. An image sensor, comprising:
a semiconductor substrate;
photodiodes formed in the semiconductor substrate;
a gas permeable layer formed over the semiconductor substrate; and
a plurality of separate air gaps covered by the gas permeable layer.

13. The image sensor of claim 12, wherein the gas permeable layer comprises inorganic material.

14. The image sensor of claim 12, wherein each air gap in the plurality of separate air gaps is formed directly over a respective one of the photodiodes.

15. The image sensor of claim 12, wherein each air gap in the plurality of separate air gaps forms a convex microlens.

16. The image sensor of claim 12, wherein each air gap in the plurality of separate air gaps forms a concave microlens.

17. The image sensor of claim 12, wherein each air gap in the plurality of separate air gaps is configured as a trench isolation structure in the semiconductor substrate.

18. The image sensor of claim 12, further comprising:
color filter elements formed over the photodiodes, wherein each air gap in the plurality of separate air gaps is configured as an isolation structure between a respective pair of the color filter elements.

19. A method of manufacturing an image sensor, comprising:
forming photodiodes in a semiconductor substrate;
forming microlenses over the photodiodes; and
forming a gas permeable layer over the microlenses.

20. The method of claim 19, further comprising:
forming an inorganic layer on the microlenses to prevent structures underneath the inorganic layer from sublimating through the gas permeable layer, wherein forming the gas permeable layer comprises exposing a hybrid organic and inorganic layer to energy to sublimate away an organic portion of the hybrid organic and inorganic layer.

* * * * *